United States Patent [19]

Phy

[11] Patent Number: 5,008,997
[45] Date of Patent: Apr. 23, 1991

[54] GOLD/TIN EUTECTIC BONDING FOR TAPE AUTOMATED BONDING PROCESS

[75] Inventor: William S. Phy, Los Altos Hills, Calif.

[73] Assignee: National Semiconductor, Santa Clara, Calif.

[21] Appl. No.: 443,011

[22] Filed: Nov. 28, 1989

Related U.S. Application Data

[63] Continuation of Ser. No. 245,864, Sep. 16, 1988, abandoned.

[51] Int. Cl.$^5$ .................... B23K 31/02; H01L 23/48; H01L 29/54
[52] U.S. Cl. ........................................ 29/827; 29/840; 228/180.2; 437/209
[58] Field of Search ................ 29/827, 839, 840, 843, 29/860; 228/180.2; 437/183, 209

[56] References Cited

U.S. PATENT DOCUMENTS

| | | |
|---|---|---|
| 3,648,357 | 3/1972 | Green, Jr. .................. 228/238 X |
| 3,659,035 | 4/1972 | Planzo . |
| 3,716,907 | 2/1973 | Anderson ..................... 29/827 X |
| 3,911,568 | 10/1975 | Hartleroad et al. . |
| 3,999,280 | 12/1976 | Hansen et al. . |
| 4,123,293 | 10/1978 | Okikawa et al. . |
| 4,188,438 | 2/1980 | Burns . |
| 4,210,926 | 7/1980 | Hacke . |
| 4,214,364 | 7/1980 | St. Louis et al. .................... 29/827 |
| 4,308,339 | 12/1981 | Lindberg . |
| 4,319,397 | 3/1982 | Tanabe et al. . |
| 4,418,857 | 12/1983 | Ainslie et al. ............... 228/180.2 X |
| 4,530,152 | 7/1985 | Roche et al. . |
| 4,631,805 | 12/1986 | Olsen et al. . |
| 4,875,617 | 10/1989 | Citowsky ........................... 228/123 |

FOREIGN PATENT DOCUMENTS 76556 6/1981 Japan ................................. 228/180.2

Primary Examiner—Joseph M. Gorski
Attorney, Agent, or Firm—Lee Patch; James M. Heslin

[57] ABSTRACT

An improved tape automated bonding method of bonding the beam leads of lead frame tape to gold bumps formed on the contact pads of a semiconductor device, wherein the tape includes a plurality of interconnected beam leads defined by at least one opening in the tape such that each beam lead has an inner end and an outer end. The method includes the steps of depositing a gold layer on the beam leads, masking a region of each beam lead from further deposition of material such that a predetermined portion of each beam lead is exposed for further deposition of material, depositing a predetermined amount of tin on the exposed portion of each beam lead, establishing contact between each beam lead and the die bump to which each beam lead is to be bonded and applying a predetermined amount of pressure and heat to form a bond between each beam lead and the die bump to which the beam lead is to be bonded such that the bond formed includes the primary eutectic of the combination of tin and gold.

14 Claims, 4 Drawing Sheets

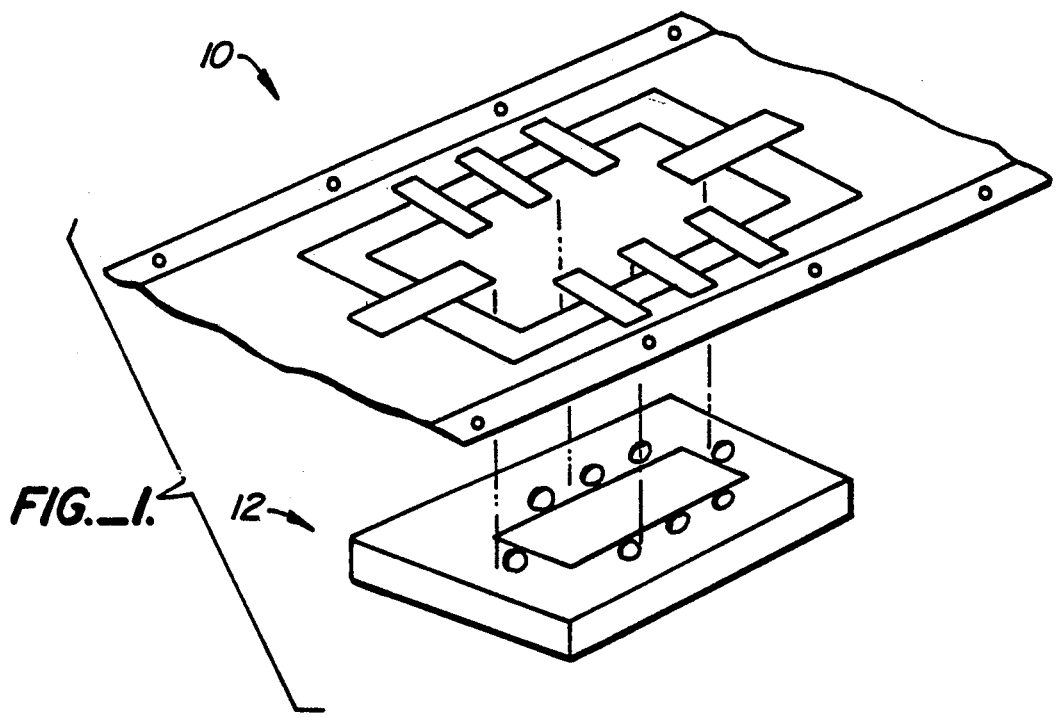
FIG._1.
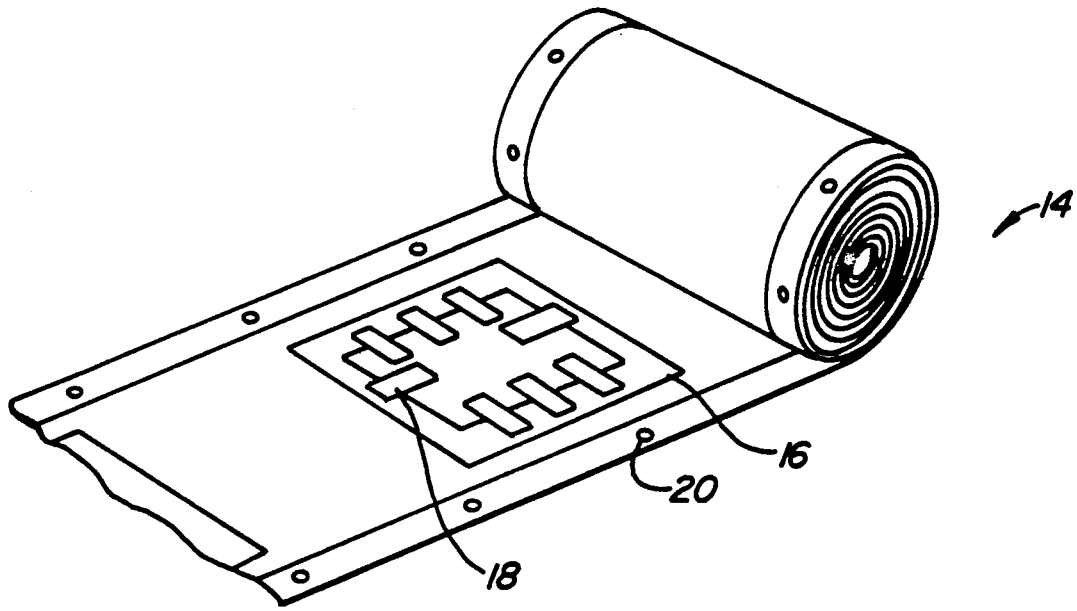
FIG._2A.

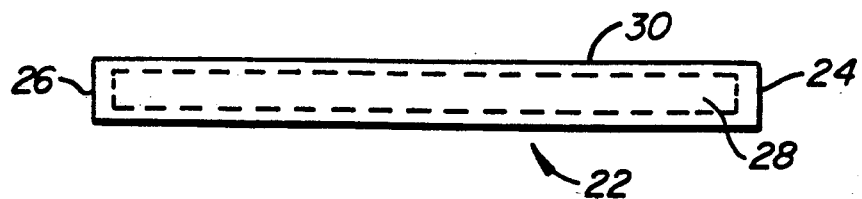
FIG._2B.
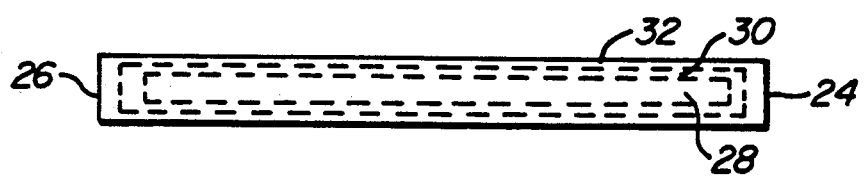
FIG._2C.
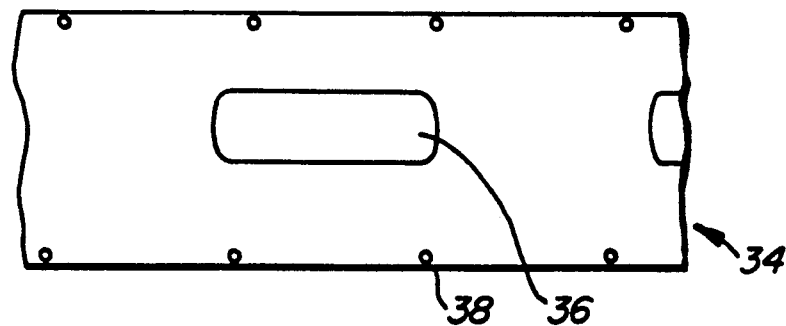
FIG._2D.
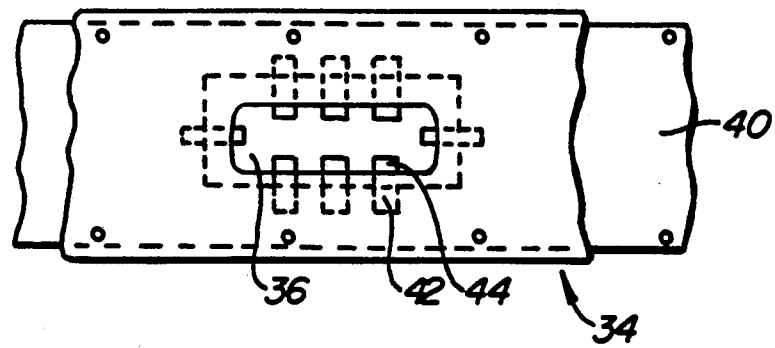
FIG._2E.

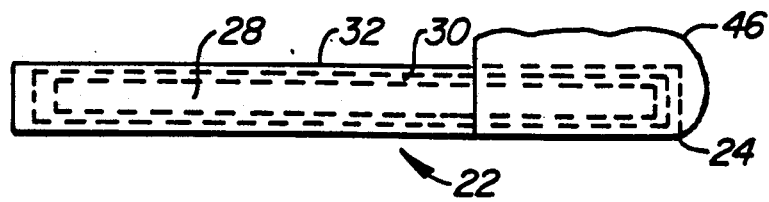
FIG._2F.
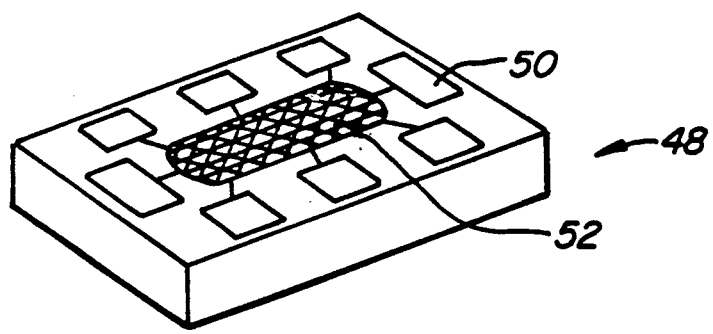
FIG._3A.
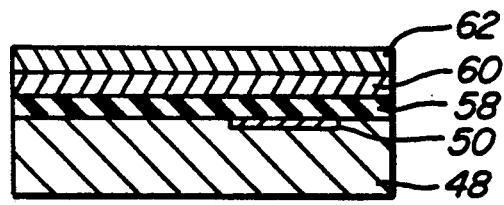
FIG._3B.
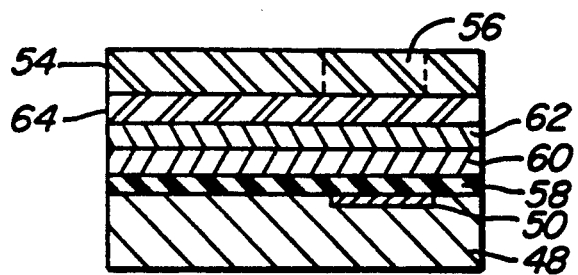
FIG._3C.

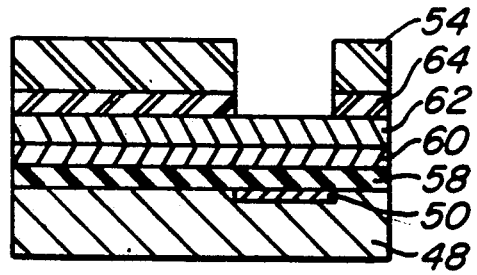
FIG._3D.
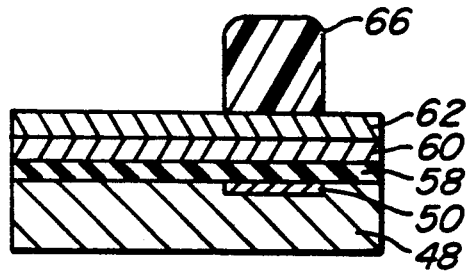
FIG._3E.
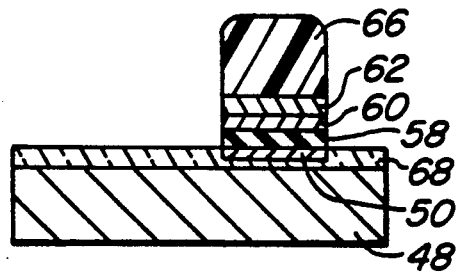
FIG._3F.
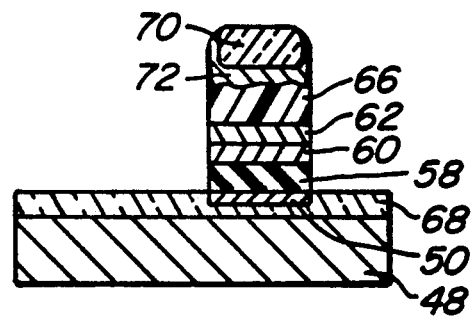
FIG._4.

GOLD/TIN EUTECTIC BONDING FOR TAPE AUTOMATED BONDING PROCESS

This is a continuation of application Ser. No. 07/245,864, filed Sept. 16, 1988, now abandoned.

BACKGROUND OF THE INVENTION

1. Field of the Invention

The present invention relates generally to tape automated bonding fabrication of semiconductor devices, and more specifically to an improved tape including an arrangement of gold and tin on the connector leads and a method of making and using same.

2. Description of the Prior Art

Tape automated bonding is a method for simultaneously connecting a plurality of bonding pads on a semiconductor device to external circuitry. The method employs a continuous metalized tape having individual frames defining metal leads which are arranged in a pattern so that the inner ends of the leads may be bonded to the bonding pads on the device while the outer ends of the leads may be joined to a conventional integrated circuit package or left free to be otherwise connected to external circuitry.

A semiconductor device generally consists of a plurality of circuit elements, including diodes, transistors, resistors and the like, centrally located in an active region on the semiconductor die. Around the periphery of the active region are a plurality of bonding pads appropriately connected to the circuit elements. External connection is made to the circuit elements via the bonding pads. In making external connections to the bonding pads, it is common in TAB for a "bump" to be formed on the bonding pads or tape to provide solder material.

In the prior art bonding to the bumps on bonding pads of a semiconductor die is accomplished by positioning the lead in contact with the bump and applying heat and pressure to affix the lead in place. Metalization for the solder is supplied by the bump, lead, or both. In tape automated bonding, the lead is placed proximate to, or in contact with, the bump by means of aligning the lead-carrying frame relative to the semiconductor die.

Various combinations of metals for the leads and bumps have been tried to effect improved bonds. For example, in the "DELTA" process (DEnse Lead TApe) a copper-based tin-plated lead is bonded to an all gold bump. The lead is brought in contact with the bump at an applied force of 2–3 g/mil$^2$ and the interface is brought up to a temperature of 300 to 350 degrees Centigrade to form the bond. The gold and tin are in a particular ratio by weight (i.e., 80% gold to 20% tin) such that in the region of bonding the primary gold-tin eutectic is formed.

One advantage of this process over for example, gold-to-gold thermo-compression bonding is that reduced applied force and heat are required. The gold-to-gold bond requires 15–20 gm/mil$^2$ applied force and local heating to 500 degrees Centigrade or more in order to form the bond. This high temperature and pressure often has a detrimental effect on circuit components, and can result in malfunctioning or nonfunctioning componentry. Utilizing tin and gold such that the primary gold-tin eutectic is formed means that the force and temperature required to form the bond are significantly reduced. The reduced temperature and pressure results in higher yields of acceptably performing components.

One problem, however, with the use of tin in, for example, a typical eutectic process, is that tin has a tendency to form "whiskers." Whiskers are essentially metal growths that extend from a tin surface. They grow after deposition of tin on lead tape and after bonding where pure tin remains on the lead tape. The exact cause of the formation of tin whiskers is not known. Observation of the whiskers has shown that there are several types of whiskers, including needle, tubular, curl, etc. Their size can range up to five microns in diameter and up to one hundred microns in length. The whiskers can cause shorting and noise in pin tests. In short, whisker formation can have a seriously detrimental effect on device performance.

It is also known that tin whiskers form only on pure tin. They do not form on the gold-tin primary eutectic. Thus any pure tin on the lead or bump remaining after bonding is at risk of having whiskers form thereon. It is therefore desirable to consume the entire quantity of tin in formation of the gold-tin eutectic.

SUMMARY OF THE INVENTION

The present invention provides an improved bond for tape automated bonding processes. It is directed to a method of forming lead-to-bump connections of the primary gold-tin eutectic such that no unreacted tin remains on the lead or bump, thereby preventing tin whiskers. The tape allows formation of the primary gold-tin eutectic at the lead-to-bump connection without risk of growth of tin whiskers.

An improved tape is formed by depositing over a copper-based tape a layer of gold plating. A predetermined amount of tin is then deposited on the tip of the lead such that the ratio of gold to tin in both the lead and bump is at least 80% gold to 20% tin by weight. The region in which the tin is deposited is limited to the bonding interface and the amount of tin deposited is such that upon formation of the gold-tin eutectic, the entire amount of deposited tin goes into forming the gold-tin eutectic. Therefore, the tape can be formed months before use without concern for tin whisker growth that occurs during storage.

When the individual leads are brought into proximity of gold bumps formed on a semiconductor die, appropriate force and local temperature are applied to form a primary gold-tin eutectic in the bond region between the leads and the bumps.

BRIEF DESCRIPTION OF THE DRAWINGS

FIG. 1 shows a typical arrangement of bonding tape with leads and semiconductor die prior to formation of the bond;

FIG. 2A shows a roll of bonding tape partially unrolled to expose a site;

FIG. 2B shows a side elevation of a lead prior to gold plating;

FIG. 2C shows a side elevation of a gold-plated lead;

FIG. 2D shows a mask used in controlling the deposition of tin onto the lead;

FIG. 2E shows a top view of the mask in place above the section of bonding tape;

FIG. 2F shows a side elevation of a gold-plated lead having tin deposited on its inner tip;

FIG. 3A shows a typical semiconductor die having bonding pads formed thereon;

FIG. 3B shows a side elevation of a semiconductor die having an adhesion layer, barrier layer, and cathode metal layer deposited thereon;

FIG. 3C shows a side elevation of a semiconductor die having a mask positioned above a layer of photoresist;

FIG. 3D shows a side elevation of the semiconductor die having a developed photoresist layer deposited thereon;

FIG. 3E shows a side elevation of the semiconductor die having a gold bump formed thereon;

FIG. 3F shows a side elevation of a finished semiconductor die prepared for bonding; and FIG. 4 shows a side elevation of a beam lead and die bonded according to the present invention.

DETAILED DESCRIPTION OF THE PREFERRED EMBODIMENT

FIG. 1 shows a typical bonding tape 10 with leads and semiconductor die 12 with bumps prior to formation of a bond between the leads and bonding bumps on the die. The processing up to this point includes appropriate formation of the bonding tape and preparation of the bonding pads of the semiconductor die, each as further discussed below. Processing subsequent to formation of tape and die includes physically bonding the leads to the bumps, removal of the lead circuitry from the tape, and connection of the lead circuitry to the appropriate external connections such as a lead frame or semiconductor package.

The method of producing the bonding tape is shown in FIGS. 2A through 2F. The manufacture of the bonding tape starts with what is commonly referred to as "two-layer tape." This tape essentially consists of a polyimide backing for example, Kapton (a DuPont trademark), onto which a thin film of copper is deposited. The copper is covered with a thin film of photoresist, and a pattern is exposed on the photoresist using photolithographic processes well known in the art. The pattern is developed, then etched, again by processes well known in the art, such that there is a contiguous circuit throughout (i.e., all elements are connected electrically). Then, by electrodeposition of copper, the thickness of the copper layer is increased. The leads are then disconnected electrically by suitable patterning and etching steps. The tape at this point appears as shown in perspective in FIG. 2A. The length of tape 14 consists of a number of individual sites or frames 16. At this point the tape will generally have sprocket holes 20 pre-punched or etched for alignment, or other automated processing.

FIG. 2B is a side-elevation view of a typical lead or circuitry element 22 from site 16. The lead has a particular orientation wherein one end 24 (inner end) will be oriented toward the center of the site and wherein the opposite end 26 (outer end) will be oriented away from the center of the site. The base of the lead 28 is backing material, while the upper layer on the lead 30 is the deposited copper.

The next step of the process is shown in FIG. 2C. Here, a plating of between 30 and 50 micro inches of gold 32 is applied on top of the copper surface 30 of the tape. The gold is plated to substantially cover the entire lead.

At this point the tape will generally be in continuous lengths (or rolls) of as many as fifty or more sites per length. The tape is cut into strips between eight and ten inches long, which will include as many as 10 or more sites. It should be noted that the size of each site depends on the size and interconnections of each circuit being packaged. Circuits with a greater number of leads will generally require a larger site than circuits having a fewer number of leads.

A metal mask is then produced for the particular tape being used. The metal mask will generally be etched from molybdenum foil and appear as shown at 34 in FIG. 2D. Mask 34 is a strip corresponding to the length of the strip of tape. Mask 34 has a number of openings 36 corresponding to the number of sites on the strip of tape. These openings will be square, rectangular, or other appropriate shape, depending on the circuitry. Mask 34 further includes registration holes 38 for alignment with the tape.

Mask 34 is then brought into contact with an inverted subject tape strip 40, having leads 42 formed thereon, as shown in FIG. 2E. This stage of the process is shown in FIG. 2E as a top view from above the mask 34, with a portion of leads 42 extending into window 36. When mask 34 is placed atop tape strip 40, a short portion 44 of the bottom of lead 42 projects into the opening of window 36. The portion 44 of lead 42 is the inner end of the lead. The length of portion 44 of lead 42 which extends into the opening in the mask will depend on the geometry of the circuitry being utilized, but will generally be 5 to 10 mils of a lead which is as long as 50 to 60 mils.

Having now positioned mask 34 appropriately over the inverted tape strip 40, a predetermined amount of tin 46 is deposited in suitable thickness on the exposed inner end portion 44 of lead 42, as shown in FIG. 2F. Tin 46 will generally be deposited by sputtering. The details of the sputtering process are well known in the art, and therefore are not disclosed in detail herein. Since sputtering is nearly omnidirectional, almost the same amount of material will be applied to the tip of the lead as will be applied to the exposed sides (although there will in fact be slightly less material deposited on the sides than on the top surface). It should be noted that the tin could be vapor deposited onto the gold surface 32 of leads 42, in appropriate situations.

The thickness of deposited tin layer 46 will generally be on the order of 20 to 60 microinches. Again, this will vary with the particular geometries being used. It is important, however, that the ratio of gold on the lead and on the bump of the die (described below) to tin deposited be at least 80% gold to 20% tin, by weight. This ensures that the primary eutectic is formed, and that no pure tin remains after formation of the bond.

Having now completely formed the bonding tape, it is necessary to have properly prepared bonding bumps formed on the bonding pads of the semiconductor die. Referring to FIG. 3A, a typical silicon die 48 is shown having a plurality of bonding pads 50 located on its surface. The bonding pads 50 are connected to the circuitry 52 on the semiconductor die.

As shown in FIG. 3B, an adhesion layer of metal 58, for example, metals having an affinity to adherence to aluminum, such as titanium or chromium, is initially deposited on the entire surface of the semiconductor die 48. The adhesion layer is deposited by thin film deposition, such as sputtering. Then, following deposition of the adhesion layer, a barrier layer 60 is deposited to prevent migration of the bonding pad material, typically aluminum, through the adhesion layer into the to-be-formed "bump." Typical barrier layer material includes chrome (which can act both as an adhesion layer and as a barrier layer) and refractory metals such as tungsten, vanadium, and molybdenum. Next, without breaking the vacuum from the earlier deposition steps, a thin layer of gold 62 is deposited. The plane of gold 62 is commonly referred to as the cathode metal. Typically, the gold will serve as the cathode in a plating system used to build up the bump's thickness. It is deposited using a 2–3 target sputtering system capable of depositing, discretely, either a combined adhesion/barrier layer or separate adhesion and barrier layers, plus the gold layer.

The metalized wafer is now removed from the vacuum chamber and a dry film photoresist material 64 is applied to its surface. Although a liquid photoresist material may be employed dry film photoresist material is preferred since it may be applied slightly thicker than the liquid photoresist and will better control the geometry of the to-be-formed bumps.

The next step in producing the bonding bumps is to produce a bump mask 54 for the particular circuit. The mask is a standard glass photolithographic plate. The mask is set directly on the surface of the photoresist above the metalized die previously described. FIG. 3C shows silicon die 48 with mask 54 positioned in contact thereon in side elevation view.

The die is next exposed through the mask, thereby exposing regions above the pads 50. The die is then exposed and developed. Remaining on the surface of the metalized semiconductor die are a number of regions of photoresist which define discrete openings over the plane of gold 62. At this point the structure looks like that shown in FIG. 3D.

The next step of the process is to plate gold into openings 64, using the field metal 62 as a cathode. The resulting structure is shown in FIG. 3E. The gold plating builds up in the opening to a specifically controlled height of 50 to 100 or more times the thickness of the field metal 62. The photoresist 64 is removed so that the deposited gold 66 becomes an elevated bump above the surface of the field metal 62.

The gold bump is then used as a mask to etch off the field metal 62. Upon etching of the field metal, a certain amount of the gold bump will be removed as well. However, due to the relatively great thickness of bump 66, as compared to the field metal layer 62, only a small portion of bump 66 is lost in the etching. Subsequent etchings are then performed to remove the barrier and adhesion layers 60, 58 in turn. The etching will continue down to an optional dielectric layer 68 (or other material) deposited to passivate the die. The resulting structure is shown in FIG. 3F.

The leads and bumps are now ready to be bonded. The first step in this process is to pass the semiconductor die and lead bonding tape into proximate contact with one another in an inner lead bonding machine. The tape is oriented such that the primary region of tin deposition 46 is placed proximate the gold bump 66. The tape is then lowered into contact with the gold bump. Thermodes or other appropriate devices in the inner lead bonding machine apply appropriate pressure and temperature to the leads where they contact the bumps. The range of pressure applied is between 1 and 4 g/mil$^2$. Preferably, a pressure of 2–3 g/mil$^2$ is applied to the lead tips. The lead tips are heated locally to approximately 300–350 degrees Centigrade, preferably 320 degrees Centigrade. These conditions cause the primary gold-tin eutectic to form consuming the volume of tin deposited at the tip of the lead.

The resulting structure is a semiconductor die and a beam lead bonded together such that the bond has only precious metal surfaces exposed. No pure tin is exposed and, hence, the problem of tin whiskers is obviated. The bond can be formed at relatively low pressures and temperatures, thus avoiding the problem of cracking the semiconductor device or otherwise degrading its performance. FIG. 4 shows such a structure, beam lead 70 shown in end view therein. Beam lead 70 is bonded in eutectic region 72 with no pure tin remaining unreacted.

Although the foregoing invention has been described in some detail by way of illustration and example for purposes of clarity of understanding, it will be obvious that certain changes and modifications may be practiced within the scope of the appended claims. Therefore, the above description is meant by way of example and is not intended to be limiting upon the scope of the invention.

What is claimed is:

1. A tape automated bonding method of bonding copper beam leads of lead frame tape to gold die bumps formed on contract pads of a semiconductor device, wherein the tape includes a plurality of interconnected beam leads defined by at least one opening in the tape such that each beam lead has an inner end and an outer end, the method comprising:

depositing a gold layer on the copper beam leads;

masking a region of each beam lead from further deposition of material such that a predetermined portion of each beam lead is exposed for further deposition of material;

depositing by sputtering or vapor deposition a predetermined amount of tin layer on the gold layer on the exposed portion of each beam lead;

establishing contact between the tin layer on each beam lead and a gold die bump to which each beam lead is to be bonded after the tin layer has been deposited on said beam lead; and applying to the contact between each lead and die bump a predetermined amount of pressure and heat, thereby forming a bond between each beam lead and the die bump to which the beam lead is to be bonded such that the bond formed includes a primary eutectic of the combination of tin and gold with substantially no pure tin in contact with the copper beam lead.

2. The method of claim 1, wherein the depositing of a predetermined amount of tin layer deposits a weight of tin less than 20 percent of the total weight of gold deposited on both the beam lead and on the die bump to which the lead is to be bonded.

3. The method of claim 1, wherein the tin depositing step deposits tin only on the region of each beam lead where bonding to a die bump is to occur.

4. The method of claim 1, wherein the pressure and heat applying step applies pressure in the range of 1 to 4 grams per square mil.

5. The method of claim 1, wherein the pressure and heat applying step applies temperature in the range of 300 to 350 degrees centigrade.

6. The method of claim 5, wherein the steps are performed in the listed order.

7. A tape automated bonding method of bonding copper beam leads of lead frame tape to gold die bumps formed on contract pads of a semiconductor device, wherein the tape includes a plurality of interconnected beam leads defined by at least one opening in the tape such that each beam lead has an inner end and an outer end, the method consisting essentially of:

depositing a gold layer on the copper beam leads;

masking a region of each beam lead from further deposition of material such that a predetermined portion of each beam lead is exposed for further deposition of material;

depositing by sputtering or vapor deposition a predetermined amount of tin in a layer on the gold layer on the exposed portion of each beam lead;

establishing contact between the tin layer on each beam lead and a gold die bump to which each beam lead is to be bonded after the tin in a layer has been deposited on said beam lead; and applying to the contact between each lead and die bump a predetermined amount of pressure and heat, thereby forming a bond between each beam lead and the die bump to which the beam lead is to be bonded such that the bond formed includes a primary eutectic of the combination of tin and gold with substantially no pure tin in contact with the copper beam lead.

8. The method of claim 7, wherein the depositing of a predetermined amount of tin layer deposits a weight of tin less than 20 percent of the total weight of gold deposited on both the beam lead and on the die bump to which the lead is to be bonded.

9. The method of claim 7, wherein the tin depositing step deposits tin only on the region of each beam lead where bonding to a die bump is to occur.

10. The method of claim 7, wherein the pressure and heat applying step applies pressure in the range of 1 to 4 grams per square mil.

11. The method of claim 7, wherein the pressure and heat applying step applies temperature in the range of 300 to 350 degrees centigrade.

12. A tape automated bonding method of bonding copper beam leads of lead frame tape to gold die bumps formed on contact pads of a semiconductor device, wherein the tape includes a plurality of interconnected beam leads defined by at least one opening in the tape such that each beam lead has an inner end and an outer end, the method comprising:

depositing a gold layer on the copper beam leads;

masking a region of each beam lead from further deposition of material such that a predetermined portion of each beam lead is exposed for further deposition of material;

depositing by sputtering or vapor deposition a predetermined amount of tin layer on the gold layer on the exposed portion of each beam lead such that the tin is deposited only on the region of each beam lead where bonding to a die bump is to occur, and further such that the weight of tin deposited on each beam lead is less than 20 percent of the total weight of gold deposited on that beam lead together with the weight of gold making up the die bump to which that beam lead is to be bonded;

establishing contact between the tin layer on each beam lead and a gold die bump to which each beam lead is to be bonded after the tin layer has been deposited on said beam lead; and applying a pressure of between 1 and 4 grams per square mil at a temperature of from 300 to 350 degrees centigrade to the contact between each lead and die bump, thereby forming a bond between each beam lead and the die bump to which the beam lead is to be bonded such that the bond formed includes a primary eutectic of the combination of tin and gold with substantially no pure tin in contact with the copper beam lead.

13. A tape automated bonding method of bonding copper beam leads of lead frame tape to gold die bumps formed on contact pads of a semiconductor device, wherein the tape includes a plurality of interconnected beam leads defined by at least one opening in the tape such that each beam lead has an inner end and an outer end, the method consisting essentially of:

depositing a gold layer on the copper beam leads;

masking a region of each beam lead from further deposition of material such that a predetermined portion of each beam lead is exposed for further deposition of material;

depositing by sputtering or vapor deposition a predetermined amount of tin layer on the gold layer on the exposed portion of each beam lead such that the tin is deposited only on the region of each beam lead where bonding to a die bump is to occur, and further such that the weight of tin deposited on each beam lead is less than 20 percent of the total weight of gold deposited on that beam lead together with the weight of gold making up the die bump to which that beam lead is to be bonded;

establishing contact between the tin layer on each beam lead and a gold die bump to which each beam lead is to be bonded after the tin layer has been deposited on said beam lead; and applying a pressure of between 1 and 4 grams per square mil at a temperature of from 300 to 350 degrees centigrade to the contact between each lead and die bump, thereby forming a bond between each beam lead and the die bump to which the beam lead is to be bonded such that the bond formed includes a primary eutectic of the combination of tin and gold with substantially no pure tin in contact with the copper beam lead.

14. A tape automated bonding method of bonding copper beam leads of lead frame tape to gold die bumps formed on contact pads of a semiconductor device, wherein the tape includes a plurality of interconnected beam leads defined by at least one opening in the tape such that each beam lead has an inner end and an outer end, the method consisting essentially of the steps, in the following order:

depositing a gold layer on the copper beam leads;

masking a region of each beam lead from further deposition of material such that a predetermined portion of each beam lead is exposed for further deposition of material;

depositing by sputtering or vapor deposition a predetermined amount of tin layer on the gold layer on the exposed portion of each beam lead such that the tin is deposited only on the region of each beam lead where bonding to a die bump is to occur, and further such that the weight of tin deposited on each beam lead is less than 20 percent of the total weight of gold deposited on that beam lead together with the weight of gold making up the die bump to which that beam lead is to be bonded;

establishing contact between the tin layer on each beam lead and a gold die bump to which each beam lead is to be bonded after the tin layer has been deposited on said beam lead; and applying a pressure of between 1 and 4 grams per square mil at a temperature of from 300 to 350 degrees centigrade to the contact between each lead and die bump, thereby forming a bond between each beam lead and the die bump to which the beam lead is to be bonded such that the bond formed includes a primary eutectic of the combination of tin and gold with substantially no pure tin in contact with the copper beam lead.

* * * * *